(12) United States Patent
Huang

(10) Patent No.: US 12,193,186 B2
(45) Date of Patent: Jan. 7, 2025

(54) GOLD FINGER TYPE FAN FRAME AND DOUBLE-LAYER CONNECTION STRUCTURE THEREOF

(71) Applicant: Huizhou Sanchuang Technology Co., Ltd., Guangdong (CN)

(72) Inventor: Helen Huang, Zhejiang (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 220 days.

(21) Appl. No.: 18/108,670

(22) Filed: Feb. 13, 2023

(65) Prior Publication Data

US 2024/0015924 A1    Jan. 11, 2024

(30) Foreign Application Priority Data

Jul. 8, 2022    (CN) .......................... 202221759504.8

(51) Int. Cl.
| | |
|---|---|
| *H05K 7/20* | (2006.01) |
| *F04D 25/06* | (2006.01) |
| *F04D 29/52* | (2006.01) |
| *H05K 3/32* | (2006.01) |

(52) U.S. Cl.
CPC ..... *H05K 7/20172* (2013.01); *F04D 25/0693* (2013.01); *F04D 29/522* (2013.01); *H05K 3/328* (2013.01)

(58) Field of Classification Search
None
See application file for complete search history.

(56) References Cited

U.S. PATENT DOCUMENTS

| | | | |
|---|---|---|---|
| 7,048,498 B2* | 5/2006 | Kosugi | F04D 29/663 415/214.1 |
| 9,316,230 B2* | 4/2016 | Yeh | F04D 19/002 |
| 10,485,136 B2* | 11/2019 | Gopalakrishna | G06F 1/181 |
| 11,019,748 B2* | 5/2021 | Avvaru | H05K 7/1489 |
| 11,602,072 B1* | 3/2023 | Carey | H05K 7/20727 |
| 2010/0303647 A1* | 12/2010 | Ida | F04D 25/068 417/352 |
| 2013/0064650 A1* | 3/2013 | Wang | G06F 1/20 415/182.1 |

* cited by examiner

*Primary Examiner* — Courtney L Smith
(74) *Attorney, Agent, or Firm* — Demian K. Jackson; Jackson IPG PLLC

(57) ABSTRACT

Disclosed are a gold finger type fan frame and a double-layer connection structure thereof. The gold finger type fan frame includes a first frame body, a first circuit board embedded in the first frame body, and an outlet body embedded in a side of the first frame body and detachably connected to the first circuit board, where the first circuit board includes a board body and a gold finger block, and the outlet body includes a connection block, a rear plastic housing, and a wire. According to the present disclosure, the gold finger block is inserted into the outlet body, such that rapid assembly is achieved, automatic assembly on the circuit board is facilitated, and convenience of assembly is improved.

10 Claims, 8 Drawing Sheets

GOLD FINGER TYPE FAN FRAME AND DOUBLE-LAYER CONNECTION STRUCTURE THEREOF

TECHNICAL FIELD

The present disclosure relates to the technical field of fan frames, in particular to a gold finger type fan frame and a double-layer connection structure thereof.

BACKGROUND ART

A fan is generally mounted in a server for cooling internal electronic assemblies. In the prior art, when a large proportion of fan frame assemblies on the market are mounted, wires are directly welded on a circuit board, which is not conducive to automatic assembly on the circuit board, and results in failures to freely mount wires with different lengths for the whole fan frames. And, conventional testing of fan products is cumbersome to operate since the wires are usually connected manually for testing.

SUMMARY

In order to solve the problems that when a large proportion of fan frame assemblies on the market are mounted, wires are directly welded on a circuit board, which is not conducive to automatic assembly on the circuit board, and results in failures to freely mount wires with different lengths for the whole fan frames; and, conventional testing of fan products is cumbersome to operate since the wires are usually connected manually for testing, the present disclosure provides a gold finger type fan frame and a double-layer connection structure thereof, a detachable outlet body is arranged to be connected to a circuit board in the fan frame, such that the problem that the wire is welded to the circuit board and therefore is difficult to test is solved, automatic assembly on the circuit board is achieved, connection accuracy and success rates are improved, and production quality is guaranteed; connecting a test fixture is also facilitated, it is unnecessary to connect the wire one by one for testing after manually connecting the wire to the product one by one, automatic testing is implemented, operation is simple and quick and assembly is facilitated; wires with different lengths may be replaced according to different requirements, wire selection is free, operation is simple and quick, the wire is reasonably utilized, and waste of resources is reduced; and in addition, by arranging the fan frame having the double-layer connection structure, a plurality of fans may be connected, such that the problem of poor heat dissipation of the fan frame is solved, heat dissipation performance of the whole fan frame is effectively improved, normal and stable operation of the product is effectively guaranteed, operation smoothness is guaranteed, and a requirement for high-end configuration is satisfied.

In order to achieve the above objective and other related objectives, a first aspect of the present disclosure provides a gold finger type fan frame. The gold finger type fan frame includes a first frame body, a first circuit board embedded in the first frame body, and an outlet body embedded in a side of the first frame body and detachably connected to the first circuit board, where the first circuit board includes a board body, a gold finger block arranged at a side of the board body and inserted into the outlet body, and the outlet body includes a connection block connected to the gold finger block, a rear plastic housing connected to the connection block, and a wire embedded in the rear plastic housing and electrically connected to the connection block.

In an example of the first aspect, the first frame body is provided with a first recess corresponding to the board body and a second recess corresponding to the gold finger block, the first recess being in communication with the second recess; the side of the first frame body is provided with a third recess corresponding to the outlet body, the first recess is internally provided with positioning columns in a symmetric manner, and the board body is provided with positioning openings corresponding to the positioning columns; and a recess inner wall of the third recess is provided with a first clamping recess connected to the rear plastic housing in a clamping manner.

In an example of the first aspect, the connection block includes a front plastic housing, symmetrically arranged terminals embedded in the front plastic housing, and a connection plate connected to an end, far away from the front plastic housing, of each terminal, the front plastic housing including a first housing body, fourth recesses which are symmetrically provided in the first housing body and correspond to sides of the terminals, and a fifth recess which is provided in a side, far away from the terminals, of the first housing body and is located between the fourth recesses, the gold finger block being embedded in the fifth recess correspondingly, and two sides of a surface, close to the terminals, of the first housing body being provided with first clamping blocks.

In an example of the first aspect, the rear plastic housing includes a second housing body, second clamping blocks arranged on two sides of the second housing body and connected to the third recess in a clamped manner, and second clamping recesses provided on an inner side of the second housing body and connected to the first clamping blocks in a clamping manner.

In an example of the first aspect, the side of the terminal is provided with a barbed block.

A second aspect of the present disclosure provides a double-layer connection structure of a gold finger type fan frame. The double-layer connection structure of a gold finger type fan frame includes a second frame body detachably assembled to a first frame body, a second circuit board embedded on the second frame body and spaced from a first circuit board by 3.5 mm-6 mm, and an outlet body embedded on a side of the second frame body and detachably connected to the second circuit board, where the second circuit board includes a board body, a gold finger block arranged at a side of the board body and inserted into the outlet body, the outlet body includes a connection block connected to the gold finger block, a rear plastic housing connected to the connection block, and wires embedded in the rear plastic housing and electrically connected to the connection block, four corners at a lower end of the first frame body are provided with connection clamping recesses in a rectangular array manner, and an upper end of the second frame body are provided with connection clamping blocks corresponding to the connection clamping recesses.

In an example of the second aspect, the second frame body is provided with a first recess corresponding to the board body and a second recess corresponding to the gold finger block, the first recess being in communication with the second recess; the side of the second frame body is provided with a third recess corresponding to the outlet body, the first recess is internally provided with positioning columns in a symmetric manner, and the board body is provided with positioning openings corresponding to the positioning columns; and a recess inner wall of the third recess is provided with a first clamping recess connected to the rear plastic housing in a clamping manner.

In an example of the second aspect, the connection block includes front plastic housings, symmetrically arranged terminals embedded in the front plastic housing, and a connection plate connected to an end, far away from the front plastic housing, of each terminal, where each front plastic housing includes a first housing body, fourth recesses which are symmetrically provided in the first housing body and correspond to sides of the terminals, and a fifth recess which is provided in a side, far away from the terminals, of the first housing body and is located between the fourth recesses, the gold finger block being embedded in the fifth recess correspondingly, and two sides of a surface, close to the terminals, of the first housing body being provided with first clamping blocks; the two front plastic housings are arranged symmetrically up and down with respect to the rear plastic housing, and the two connection plates are arranged corresponding to the front plastic housings respectively.

In an example of the second aspect, the wires include wire A and wire B which are electrically connected to a connection plate, the wire A is vertically arranged, a joint of the wire B and the first connection plate is obliquely arranged, and an end, far away from the joint, of the wire B is arranged parallel to the wire A.

In an example of the second aspect, an inclined included angle between a plane formed by the joint of the wire B and the connection plate and the wire A is 10°-25°.

As mentioned above, the gold finger block is inserted into the outlet body, such that rapid assembly is achieved, automatic assembly on the circuit board is facilitated, convenience of assembly is improved, the connection accuracy and success rates are improved, and the production quality is guaranteed; connecting the test fixture is also facilitated, it is unnecessary to manually connect the wires one by one for testing, automatic testing is implemented, operation is simple and quick and assembly is facilitated; wires with different lengths may be replaced according to different requirements, wire selection is free, operation is simple and quick, the wire is reasonably utilized, and waste of resources is reduced; the connection clamping recesses and the connection clamping blocks are arranged on the first frame body and the second frame body respectively for clamping, such that the circuit boards are separately placed in the two frame bodies, the two circuit boards are separately cooled at the same time, in the process of guaranteeing performance of the product, heat dissipation of the circuit board is effectively improved, normal and stable operation of the product is guaranteed, operation smoothness is guaranteed, and the requirement for high-end configuration is satisfied; and the connection clamping recesses clamp the connection clamping blocks, such that placement stability of the first frame body and the second frame body are effectively guaranteed, smooth and stable operation of the circuit board is guaranteed, and structural design is compact and small, and is regular and square.

Figure 1:
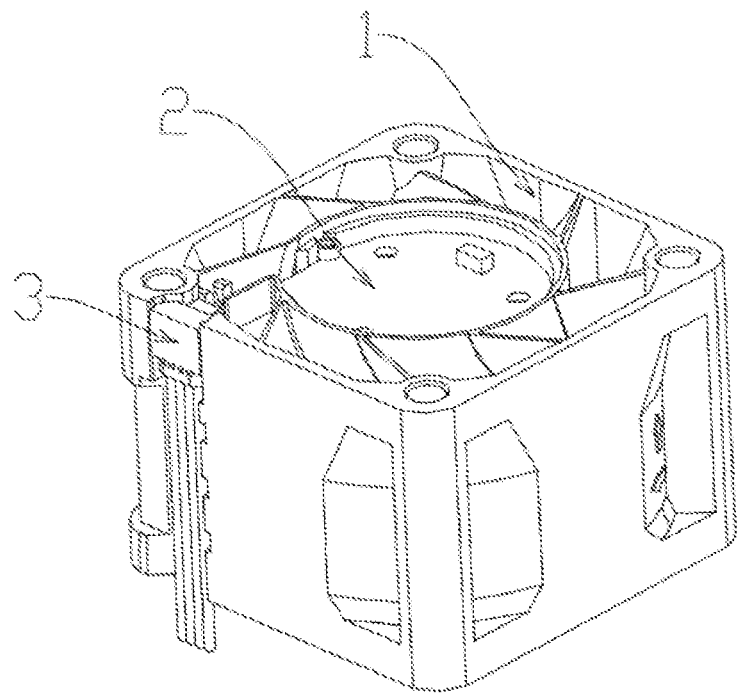
FIG. 1 is a schematic structural diagram of a gold finger type fan frame in an example of a first aspect.

REFERENCE NUMERALS IN THE FIGURES first frame body 1, first recess 10, positioning column 101, second recess 11, third recess 12, first clamping recess 120, and connection clamping recess 13; first circuit board 2, board body 20, positioning opening 201, and gold finger block 21; outlet body 3, connection block 30, front plastic housing 301, first housing body 3011, first clamping block 30111, fourth recess 3012, fifth recess 3013, terminal 302, barbed block 3021, connection plate 303, rear plastic housing 31, second clamping block 311, second clamping recess 312, second housing body 310, and wire 32;

second frame body 1', connection clamping block 10', first recess 11', and second recess 12'; second circuit board 2', board body 20', and gold finger block 21'; outlet body 3', connection block 30', front plastic housing 301', terminal 302', connection plate 303', and rear plastic housing 31'; and wire 32', wire A 32'A, and wire B 32'B.

DETAILED DESCRIPTION OF THE EMBODIMENTS

To make the above objectives, features and advantages of the present disclosure clearer and more comprehensible, specific embodiments of the present disclosure will be described below in detail with reference to accompanying drawings. In the following description, numerous specific details are set forth in order to fully understand the present disclosure. However, the present disclosure can be implemented in many other manners different from those described herein, and those skilled in the art can make similar improvements without violating the connotation of the present disclosure, so the present disclosure is not limited by the specific examples disclosed below.

Figure 2:
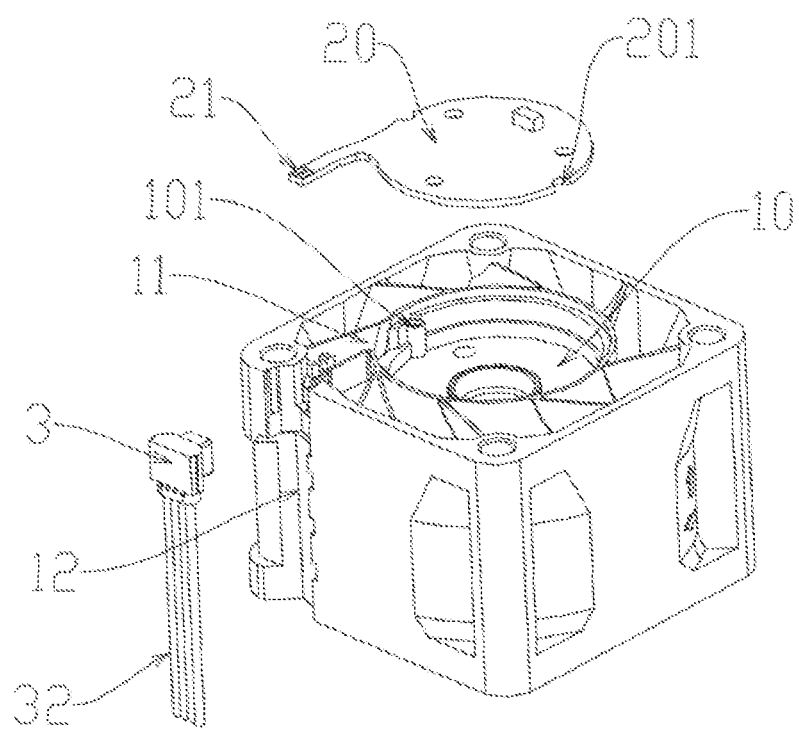
FIG. 2 is an exploded view of a gold finger type fan frame in an example of the first aspect.

With reference to FIGS. 1 and 2, a first aspect of the example of the present disclosure provides a gold finger type fan frame. The gold finger type fan frame includes a first frame body 1, a first circuit board 2 embedded in the first frame body 1, and an outlet body 3 embedded in a side of the first frame body 1 and detachably connected to the first circuit board 2, where the first circuit board 2 includes a board body 20, a gold finger block 21 arranged at a side of the board body 20 and inserted into the outlet body 3, and the outlet body 3 includes a connection block 30 connected to the gold finger block 21, a rear plastic housing 31 connected to the connection block 30, and a wire 32 embedded in the rear plastic housing 31 and electrically connected to the connection block 30. The gold finger block 21 is inserted into the outlet body 3, such that rapid assembly is achieved, automatic assembly on the circuit board is facilitated, convenience of assembly is improved, connection accuracy and success rates are improved, and production quality is guaranteed; connecting the test fixture is also facilitated, it is unnecessary to manually connect the wires 32 one by one for testing, automatic testing is implemented, operation is simple and quick and assembly is facilitated; and wires 32 with different lengths may be replaced according to different requirements, wire selection is free, operation is simple and quick, the wire 32 is reasonably utilized, and waste of resources is reduced.

In an example of the first aspect, the first frame body 1 is provided with a first recess 10 corresponding to the board body 20 and a second recess 11 corresponding to the gold finger block 21, the first recess 10 being in communication with the second recess 11. The side of the first frame body 1 is provided with a third recess 12 corresponding to the outlet body 3. Through such arrangement, the first circuit board 2 is embedded in the first frame body 1, such that operation stability of the first circuit board 2 and the outlet body 3 are guaranteed, and structural design is compact. The first recess 10 is internally provided with positioning columns 101 in a symmetric manner, and the board body 20 is provided with positioning openings 201 corresponding to the positioning columns 101. Through such arrangement, the positioning openings 201 of the board body 20 are placed corresponding to the positioning columns 101, such that stability of the board body 20 in the first recess 10 is effectively guaranteed, the board body 20 is prevented from rotating in the first recess 10, stability of the gold finger block 21 is indirectly protected, the phenomenon of poor contact between the gold finger block 21 and the outlet body 3 is reduced, and service life of the gold finger block 21 is effectively guaranteed.

In an example of the first aspect, the connection block 30 includes a front plastic housing 301, symmetrically arranged terminals 302 embedded in the front plastic housing 301, and a connection plate 303 connected to an end, far away from the front plastic housing 301, of each terminal 302, the front plastic housing 301 including a first housing body 3011, fourth recesses 3012 which are symmetrically provided in the first housing body 3011 and correspond to sides of the terminals 302, and a fifth recess 3013 which is provided in a side, far away from the terminals 302, of the first housing body 3011 and is located between the fourth recesses 3012, the gold finger block 21 being embedded in the fifth recess 3013 correspondingly. Through such arrangement, tight connection between the front plastic housing 301 and the terminal 302 is guaranteed, and the gold finger block 21 is connected to the terminal 302 by means of the fifth recess 3013, and stability of the connection is effectively guaranteed through the structural arrangement.

In an example of the first aspect, a recess inner wall of the third recess 12 is provided with a first clamping recess 120 connected to the rear plastic housing 31 in a clamping manner, the rear plastic housing 31 includes a second housing body 310, second clamping blocks 311 arranged on two sides of the second housing body 310 and connected to the third recess 12 in a clamped manner, and second clamping recesses 312 provided on an inner side of the second housing body 310 and connected to the first clamping blocks 30111 in a clamping manner. The rear plastic housing 31 is embedded in the frame body by means of the second clamping blocks 311, such that the outlet body 3 may be conveniently, efficiently and stably connected to the gold finger block 21.

In an example of the first aspect, two sides of a surface, close to the terminals 302, of the first housing body 3011 are provided with first clamping blocks 30111. The second clamping recesses 312 and the first clamping blocks 30111 are arranged in cooperation, such that stable connection between the front plastic housing 301 and the rear plastic housing 31 is guaranteed, the first housing 3011 is effectively prevented from falling off, and connection stability is improved.

In an example of the first aspect, the side of the terminal 302 is provided with a barbed block 3021. The barbed block 3021 clamps an inner wall of the fourth recess 3012, such that stable connection between the terminal 302 and the first housing body 3011 is effectively guaranteed, and stability of electrical connection is guaranteed.

To sum up, according to the gold finger type fan frame provided in the first aspect, the detachable outlet body 3 is arranged to be connected to the circuit board 2 in the fan frame, such that the problem that the wire 32 is welded to the circuit board 2 and therefore is difficult to test is solved, automatic assembly on the circuit board is achieved, connection accuracy and success rates are improved, and production quality is guaranteed. Connecting the test fixture is also facilitated, it is unnecessary to manually connect the wires 32 one by one for testing, automatic testing is implemented, operation is simple and quick and assembly is facilitated; and wires 32 with different lengths may be replaced according to different requirements, wire selection is free, operation is simple and quick, the wire 32 is reasonably utilized, and waste of resources is reduced.

Figure 3:
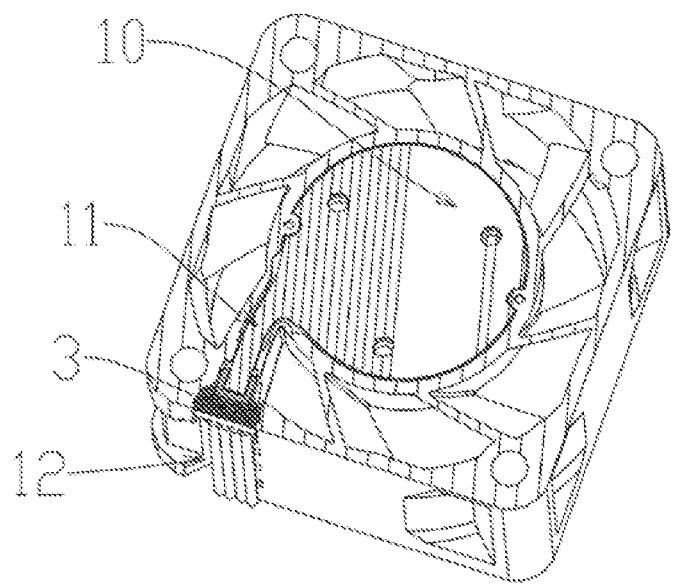
FIG. 3 is a cross-sectional view of a gold finger type fan frame in an example of the first aspect.
Figure 4:
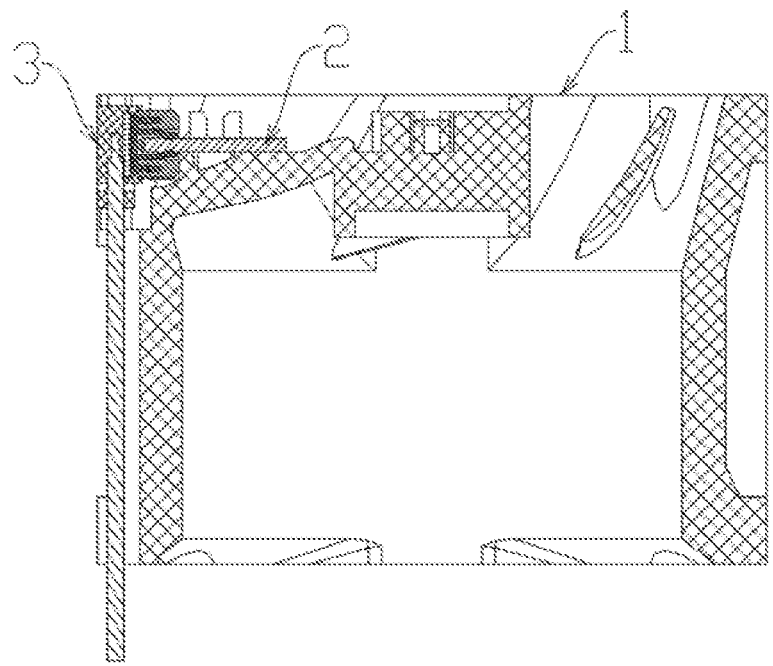
FIG. 4 is a vertical-sectional view of a gold finger type fan frame in an example of the first aspect.
Figure 5:
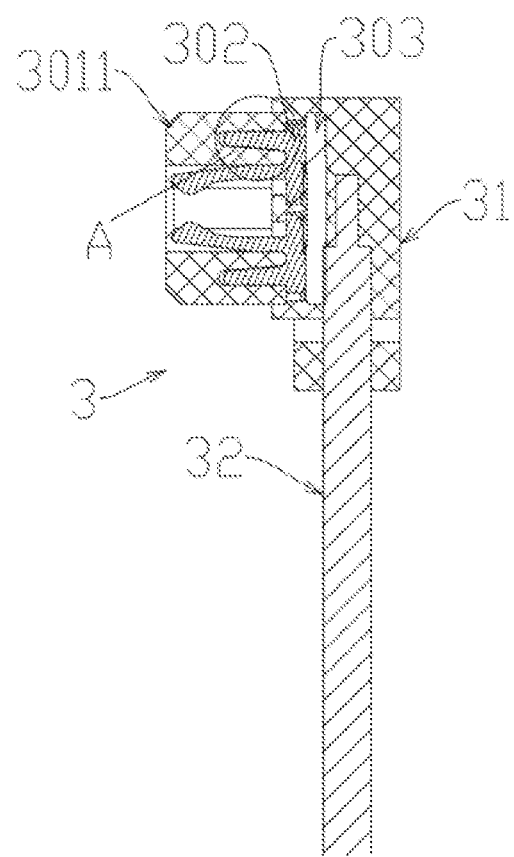
FIG. 5 is a vertical sectional view of an outlet body in an example of the first aspect.
Figure 6:
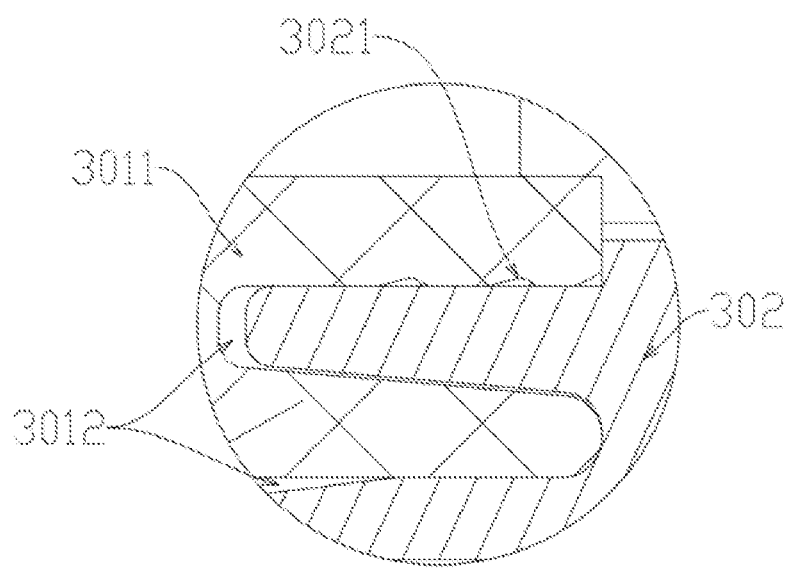
FIG. 6 is a enlarged view at portion A in FIG. 5.
Figure 7:
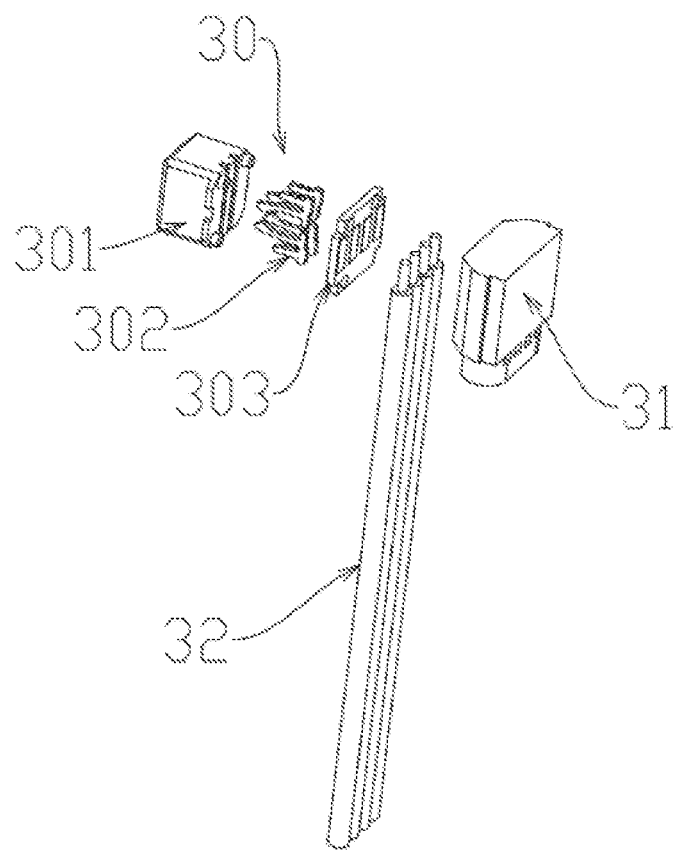
FIG. 7 is an exploded view of an outlet body in an example of the first aspect.
Figure 8:
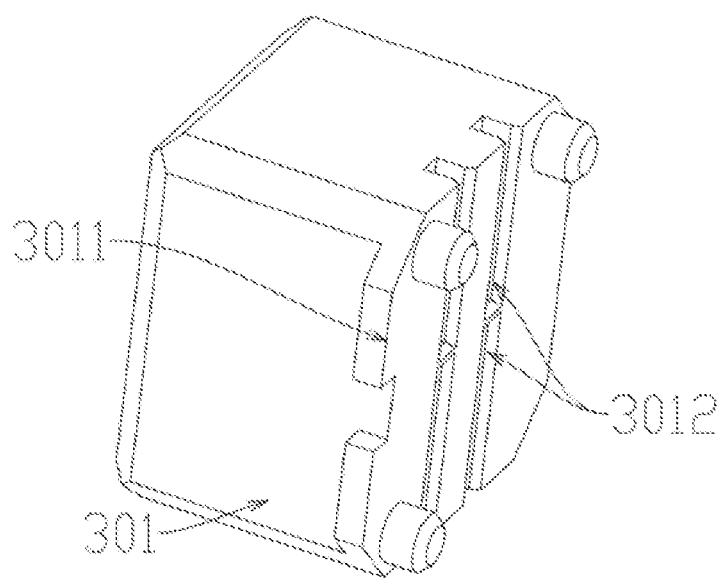
FIG. 8 is a schematic structural diagram of a front plastic housing in an example of the first aspect.
Figure 9:
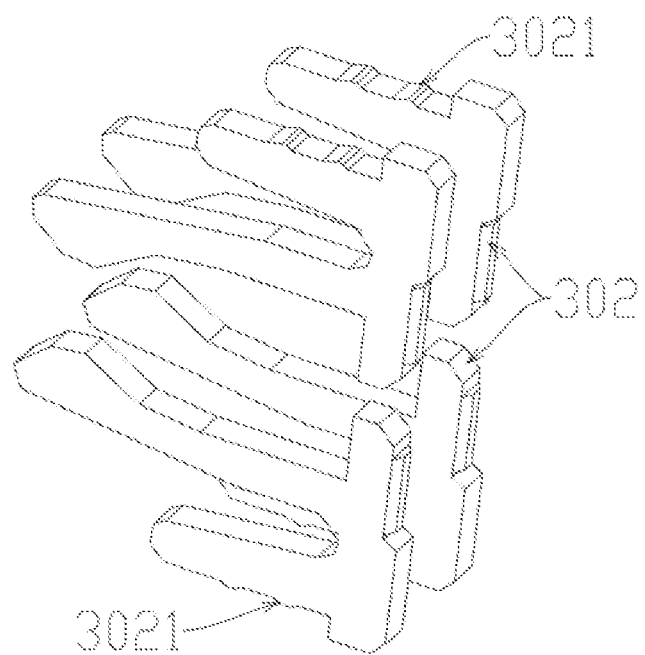
FIG. 9 is a schematic structural diagram of a terminal in an example of the first aspect.
Figure 10:
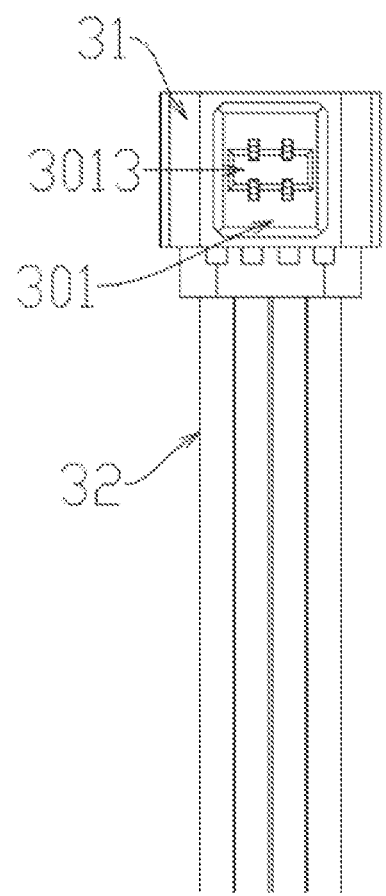
FIG. 10 is a structural view of an outlet body in an example of the first aspect.
Figure 11:
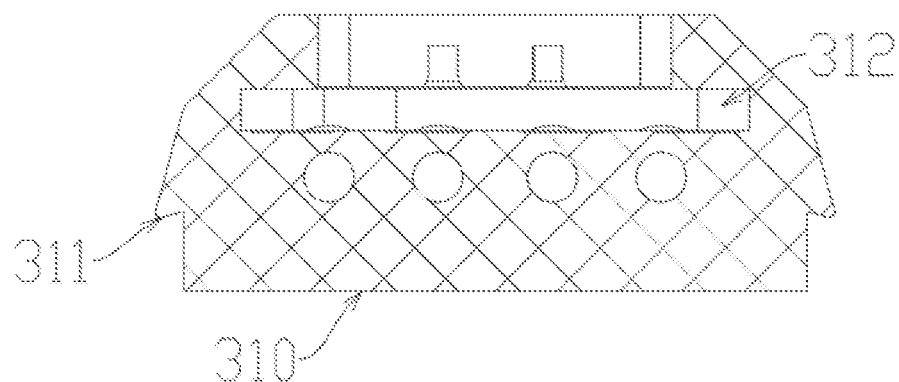
FIG. 11 is a sectional view of a rear plastic housing in an example of the first aspect.
Figure 12:
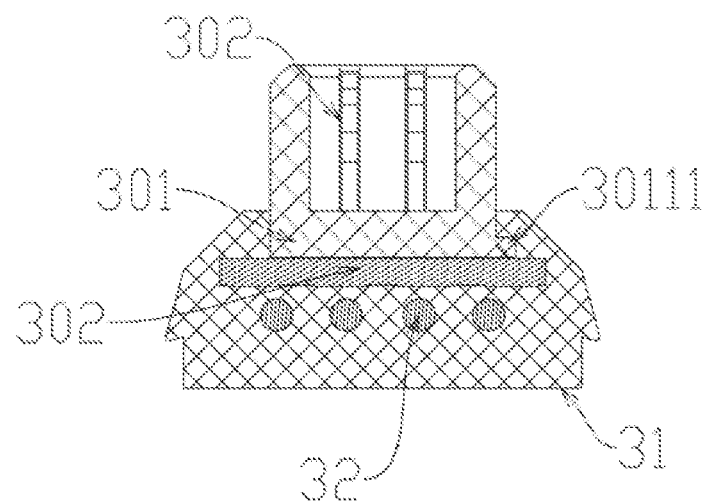
FIG. 12 is a cross-sectional view of an outlet body in an example of the first aspect.
Figure 13:
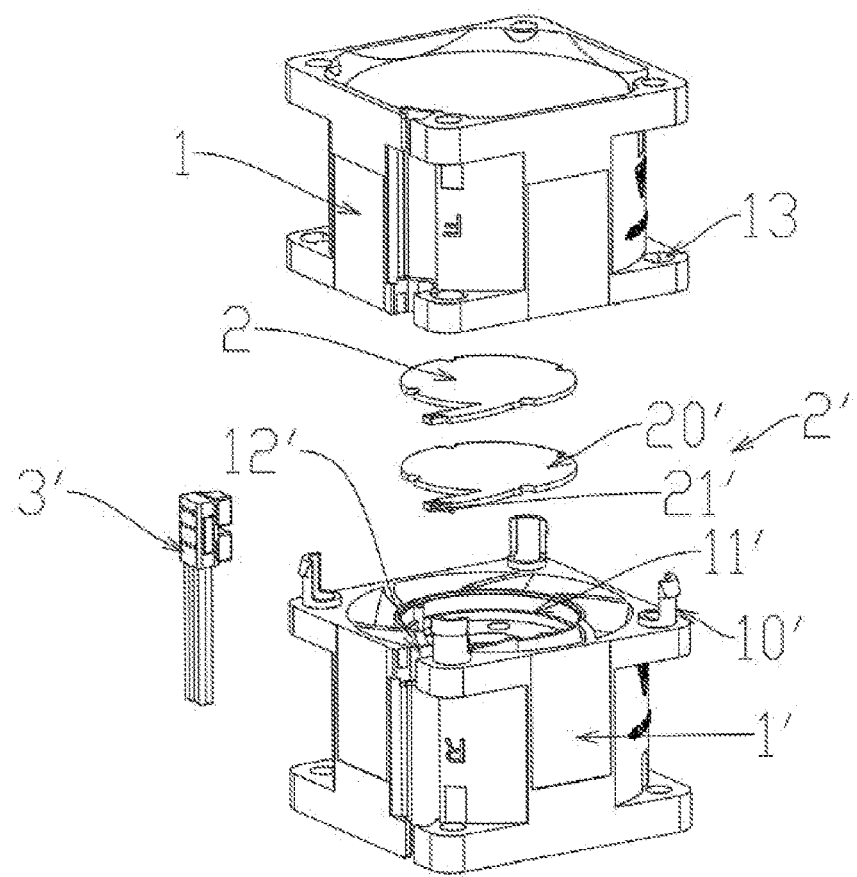
FIG. 13 is a schematic structural diagram of a double-layer connection structure of a gold finger type fan frame in an example of a second aspect.
Figure 14:
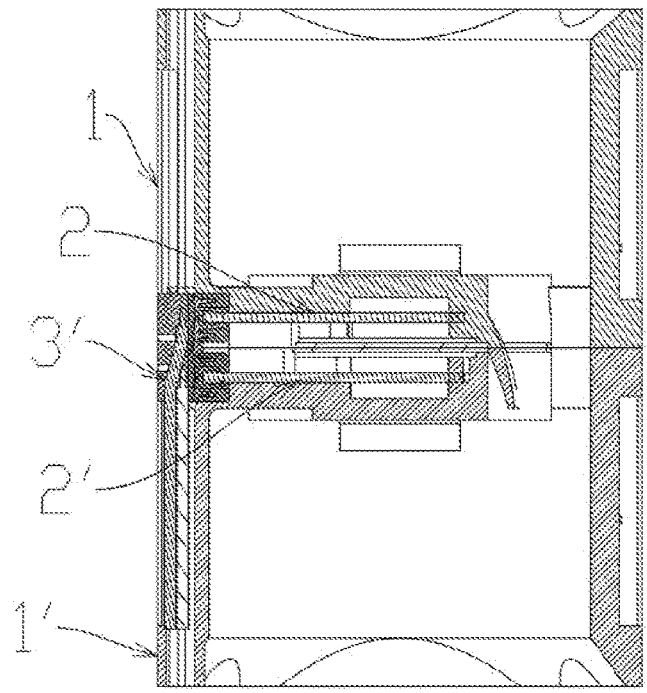
FIG. 14 is a cross-sectional view of a double-layer connection structure of a gold finger type fan frame in an example of the second aspect.
Figure 15:
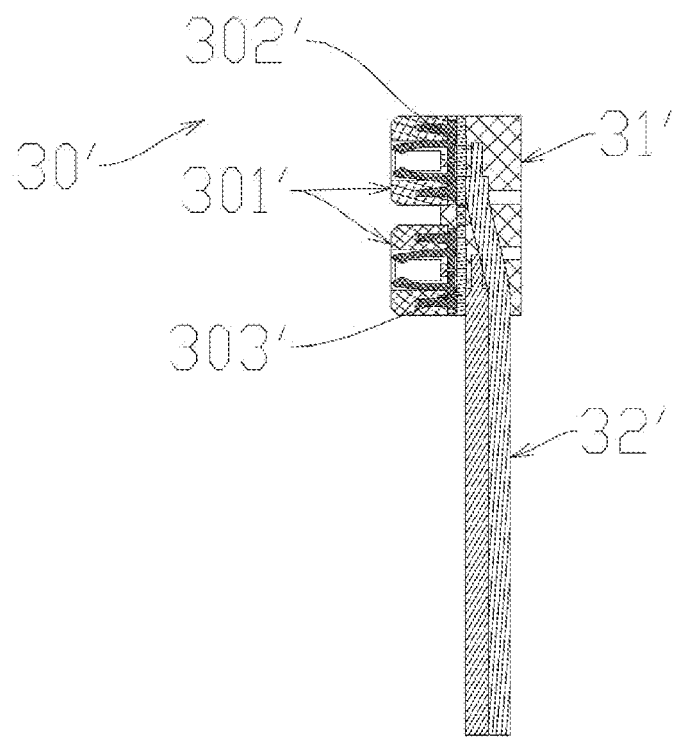
FIG. 15 is a vertical sectional view of an outlet body in an example of the second aspect.
Figure 16:
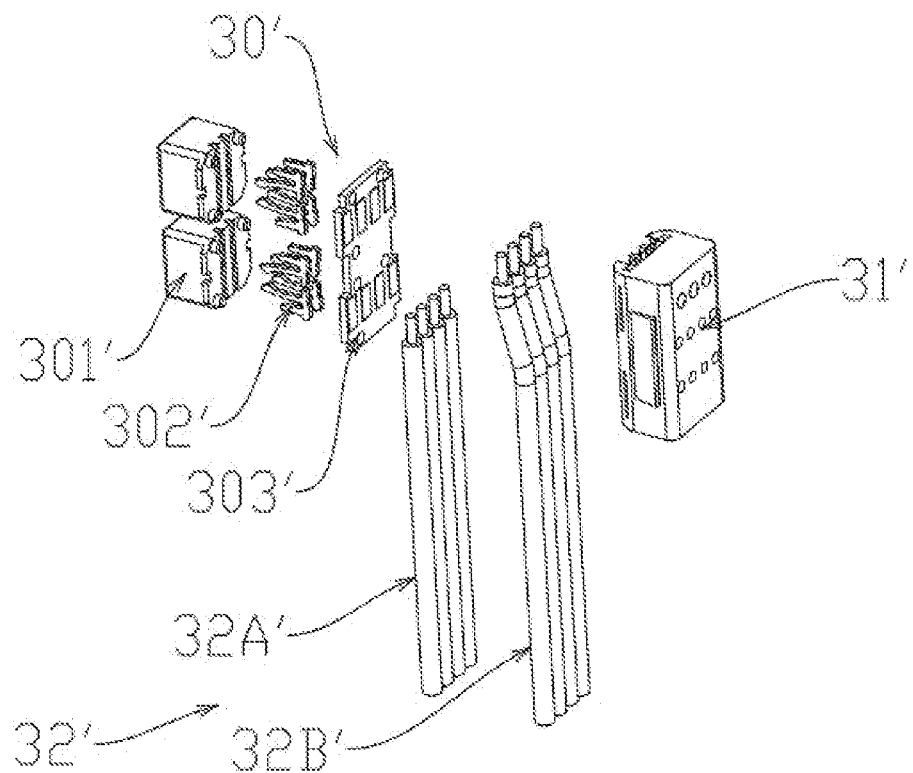
FIG. 16 is an exploded view of an outlet body in an example of the second aspect.

With reference to FIGS. 3 and 4, a second aspect of the example of the present disclosure provides a double-layer connection structure of a gold finger type fan frame. The double-layer connection structure of a gold finger type fan frame includes a second frame body 1' detachably assembled to a first frame body 1 and a second circuit board 2' embedded on the second frame body 1' and spaced from a first circuit board 2 by 3.5 mm-6 mm. The first circuit board 2 is spaced from the second circuit board 2' by 3.5 mm-6 mm, such that independent fans are arranged on an upper side and a lower side of the circuit board to dissipate heat from the circuit board, and there is a safe heat dissipation distance between the two circuit boards, thereby effectively improving heat dissipation performance while guaranteeing a compact structure. The double-layer connection structure of a gold finger type fan frame further includes an outlet body 3' embedded on a side of the second frame body 1' and detachably connected to the second circuit board 2', where the second circuit board 2' includes a board body 20', a gold finger block 21' arranged at a side of the board body 20' and inserted into the outlet body 3', the outlet body 3' includes a connection block 30' connected to the gold finger block 21', a rear plastic housing 31' connected to the connection block 30', and wires 32' embedded in the rear plastic housing 31' and electrically connected to the connection block 30', four corners at a lower end of the first frame body 1 are provided with connection clamping recesses 13 in a rectangular array manner, and an upper end of the second frame body 1' are provided with connection clamping blocks 10' corresponding to the connection clamping recesses 13. The connection clamping recesses 13 and the connection clamping blocks 10' are arranged on the first frame body 1 and the second frame body 1' respectively for clamping, such that the circuit boards are separately placed in the two frame bodies, the two circuit boards are separately cooled at the same time, in the process of guaranteeing performance of the product, heat dissipation of the circuit board is effectively improved, normal and stable operation of the product is guaranteed, operation smoothness is guaranteed, and the requirement for high-end configuration is satisfied. The connection clamping recesses 13 clamp the connection clamping blocks 10', such that placement stability of the first frame body 1 and the second frame body 1' are effectively guaranteed, smooth and stable operation of the circuit board is guaranteed, and structural design is compact and small, and is regular and square.

In an example of the second aspect, the second frame body 1' is provided with a first recess 11' corresponding to the board body 20' and a second recess 12' corresponding to the gold finger block 21', the first recess 11' being in communication with the second recess 12'; the side of the second frame body 1' is provided with a third recess 13' corresponding to the outlet body 3', the first recess 11' is internally provided with positioning columns in a symmetric manner, and the board body 20' is provided with positioning openings corresponding to the positioning columns; and a recess inner wall of the third recess 13' is provided with a first clamping recess connected to the rear plastic housing 31' in a clamping manner. It should be noted that the third recess 13' on the second frame body 1' is in communication with the third recess 12 on the first frame body 1, such that the outlet body may be conveniently connected 3' to the first circuit board 2 and the second circuit board 2' respectively.

In an example of the second aspect, the connection block 30' includes front plastic housings 301', symmetrically arranged terminals 302' embedded in the front plastic housing 301', and a connection plate 303' connected to an end, far away from the front plastic housing 301', of each terminal 302', where each front plastic housing 301' includes a first housing body, fourth recesses which are symmetrically provided in the first housing body and correspond to sides of the terminals 302', and a fifth recess which is provided in a side, far away from the terminals, of the first housing body and is located between the fourth recesses, the gold finger block 21' being embedded in the fifth recess correspondingly, and two sides of a surface, close to the terminals 302', of the first housing body being provided with first clamping blocks; the two front plastic housings 301' are arranged symmetrically up and down with respect to the rear plastic housing 31', and the two connection plates 303' are arranged corresponding to the front plastic housings 301' respectively. Through such arrangement, the first circuit board and the second circuit board 2' are guaranteed to be electrically connected to the outlet body 3' independently, independence of product operation is guaranteed, and stability of operation is improved.

In an example of the second aspect, the wires 32' include wire A 32'A and wire B 32'B which are electrically connected to a connection plate 303', the wire A 32'A is vertically arranged, a joint of the wire B 32'B and the connection plate 303' is obliquely arranged, an end, far away from the joint, of the wire B 32'B is arranged parallel to the wire A 32'A, and an inclined included angle between a plane formed by the joint of the wire B 32'B and the connection plate 303' and the wire A 32'A is 10°-25°. Through the arrangement of the wires 32', neat placement of independently connected wires is guaranteed, such that neat and beautiful arrangement of the wires 32' is improved.

To sum up, according to the double-layer connection structure of a gold finger type fan frame provided by the second aspect, through the design of the fan frame, the problem of poor heat dissipation of the fan frame is solved, heat dissipation performance of the whole fan frame is effectively improved, normal and stable operation of the product is effectively guaranteed, operation smoothness is guaranteed, and a requirement for high-end configuration is satisfied.

Various technical features of the examples above may be arbitrarily combined. To simplify description, all possible combinations of various technical features of the examples above are not described. However, if only the combinations of these technical features do not conflict, they shall be considered to fall within the scope of description of the description.

The examples above are merely several types of embodiments of the present disclosure, and are specifically described in details, but cannot be construed as limitation to the scope of the patent for the invention as a result. It shall be noted that for those of ordinary skill in the field, they can make several variations and improvements on the premise without deviating from concepts of the present disclosure, these variations and improvements shall be considered to fall within the protection scope of the present disclosure. Hence, the protection scope of the patent for the invention shall be subject to the appended claims.

What is claimed is:

1. A gold finger type fan frame, comprising a first frame body, a first circuit board embedded in the first frame body, and an outlet body embedded in a side of the first frame body and detachably connected to the first circuit board, wherein the first circuit board comprises a board body, a gold finger block arranged at a side of the board body and inserted into the outlet body, and the outlet body comprises a connection block connected to the gold finger block, a rear plastic housing connected to the connection block, and a wire embedded in the rear plastic housing and electrically connected to the connection block.

2. The gold finger type fan frame according to claim 1, wherein the first frame body is provided with a first recess corresponding to the board body and a second recess corresponding to the gold finger block, the first recess being in communication with the second recess; the side of the first frame body is provided with a third recess corresponding to the outlet body, the first recess is internally provided with positioning columns in a symmetric manner, and the board body is provided with positioning openings corresponding to the positioning columns; and a recess inner wall of the third recess is provided with a first clamping recess connected to the rear plastic housing in a clamping manner.

3. The gold finger type fan frame according to claim 1, wherein the connection block comprises a front plastic housing, symmetrically arranged terminals embedded in the front plastic housing, and a connection plate connected to an end, far away from the front plastic housing, of each terminal, the front plastic housing comprising a first housing body, fourth recesses which are symmetrically provided in the first housing body and correspond to sides of the terminals, and a fifth recess which is provided in a side, far away from the terminals, of the first housing body and is located between the fourth recesses, the gold finger block being embedded in the fifth recess correspondingly, and two sides of a surface, close to the terminals, of the first housing body being provided with first clamping blocks.

4. The gold finger type fan frame according to claim 3, wherein the rear plastic housing comprises a second housing body, second clamping blocks arranged on two sides of the second housing body and connected to the third recess in a clamped manner, and second clamping recesses provided on an inner side of the second housing body and connected to the first clamping blocks in a clamping manner.

5. The gold finger type fan frame according to claim 3, wherein the side of the terminal is provided with a barbed block.

6. A double-layer connection structure of a gold finger type fan frame, comprising a second frame body detachably assembled to a first frame body, a second circuit board embedded on the second frame body and spaced from a first circuit board by 3.5 mm-6 mm, and an outlet body embedded on a side of the second frame body and detachably connected to the second circuit board, wherein the second circuit board comprises a board body, a gold finger block arranged at a side of the board body and inserted into the outlet body, the outlet body comprises a connection block connected to the gold finger block, a rear plastic housing connected to the connection block, and wires embedded in the rear plastic housing and electrically connected to the connection block, four corners at a lower end of the first frame body are provided with connection clamping recesses in a rectangular array manner, and an upper end of the second frame body are provided with connection clamping blocks corresponding to the connection clamping recesses.

7. The double-layer connection structure of a gold finger type fan frame according to claim 6, wherein the second frame body is provided with a first recess corresponding to the board body and a second recess corresponding to the gold finger block, the first recess being in communication with the second recess; the side of the second frame body is provided with a third recess corresponding to the outlet body, the first recess is internally provided with positioning columns in a symmetric manner, and the board body is provided with positioning openings corresponding to the positioning columns; and a recess inner wall of the third recess is provided with a first clamping recess connected to the rear plastic housing in a clamping manner.

8. The double-layer connection structure of a gold finger type fan frame according to claim 6, wherein the connection block comprises front plastic housings, symmetrically arranged terminals embedded in the front plastic housing, and a connection plate connected to an end, far away from the front plastic housing, of each terminal, wherein each front plastic housing comprises a first housing body, fourth recesses which are symmetrically provided in the first housing body and correspond to sides of the terminals, and a fifth recess which is provided in a side, far away from the terminals, of the first housing body and is located between the fourth recesses, the gold finger block being embedded in the fifth recess correspondingly, and two sides of a surface, close to the terminals, of the first housing body being provided with first clamping blocks; the two front plastic housings are arranged symmetrically up and down with respect to the rear plastic housing, and the two connection plates are arranged corresponding to the front plastic housings respectively.

9. The double-layer connection structure of a gold finger type fan frame according to claim 6, wherein the wires comprise wire A and wire B which are electrically connected to a connection plate, the wire A is vertically arranged, a joint of the wire B and the first connection plate is obliquely arranged, and an end, far away from the joint, of the wire B is arranged parallel to the wire A.

10. The double-layer connection structure of a gold finger type fan frame according to claim 9, wherein an inclined included angle between a plane formed by the joint of the wire B and the connection plate and the wire A is 10°-25°.

* * * * *